Aug. 20, 1968 I. H. MARANTZ ETAL 3,397,736

APPARATUS FOR MAKING THERMOELECTRIC ELEMENTS

Filed Jan. 25, 1965 4 Sheets-Sheet 1

INVENTORS
ISRAEL H. MARANTZ
DANIEL R. MARANTZ
BY
Dean, Fairbank & Hirsch
ATTORNEYS INVENTORS
ISRAEL H. MARANTZ
DANIEL R. MARANTZ
BY
Dean, Fairbank & Hirsch
ATTORNEYS

APPARATUS FOR MAKING THERMOELECTRIC ELEMENTS

Filed Jan. 25, 1965 4 Sheets-Sheet 3

INVENTORS
ISRAEL H. MARANTZ
DANIEL R. MARANTZ
BY
Dean, Fairbank & Hirsch
ATTORNEYS

APPARATUS FOR MAKING THERMOELECTRIC ELEMENTS

Filed Jan. 25, 1965 4 Sheets-Sheet 4

INVENTORS
ISRAEL H. MARANTZ
DANIEL R. MARANTZ
BY
Dean, Fairbank & Hirsch
ATTORNEYS

3,397,736
APPARATUS FOR MAKING THERMO-ELECTRIC ELEMENTS

Israel H. Marantz, Forest Hills, and Daniel R. Marantz, Port Washington, N.Y., assignors to Marantz Industries Corp., Port Washington, N.Y., a corporation of New York Filed Jan. 25, 1965, Ser. No. 427,690
8 Claims. (Cl. 164—267)

Figures 1, 3:
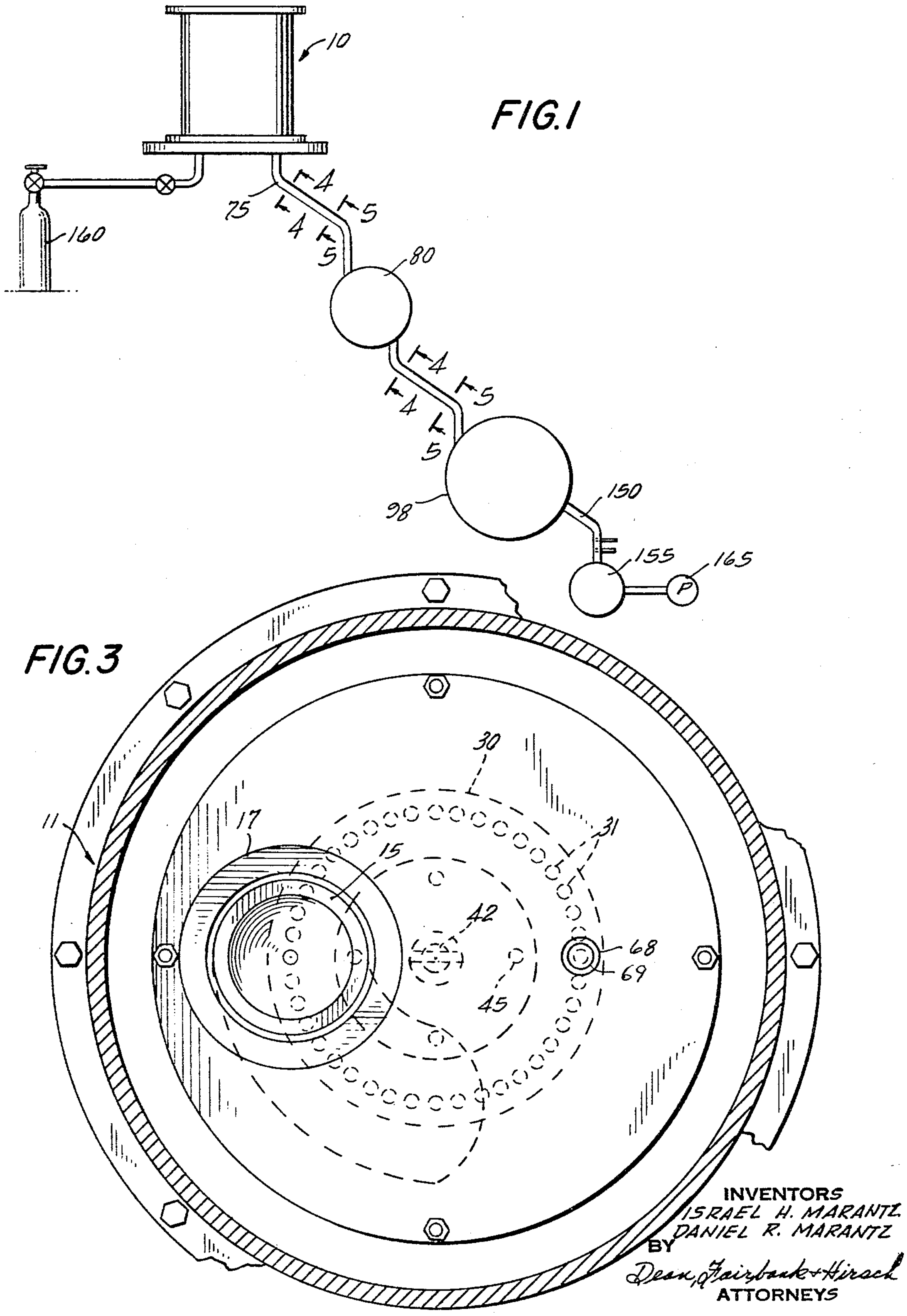

This invention relates to the art of thermoelectric elements, more particularly to an improved method and apparatus for forming individual thermoelectric elements, each element provided with appropriate solder coated surfaces to implement use of the thermoelectric elements in the formation of a module.

As conducive to an understanding of the invention, it will be recognized by those skilled in the art that a variety of thermoelectric devices have been evolved based on Peltier or Seebeck effects. Thus, thermoelectric generators have been developed in which electrical currents are generated by maintaining the junctions between dissimilar metals at different temperatures with a resultant flow of electricity through the junction. Additionally, a number of heat pumping structures have been developed for cooling or heating purposes in which an electrical current is caused to flow across the conductive junction of two dissimilar metals with the resultant evolution or absorption of heat at the junction of the metals, depending on the direction of current flow through the junction.

Such thermoelectric devices utilize thermoelectric elements arranged in multiple arrays or groups called modules. The materials most commonly employed at present in the production of thermoelectric elements are $Bi_2(Te, Se)_3$ alloys for negative or N-type thermoelectric elements and $(Bi, Sb)_2(Te, Se)_3$ alloys for the positive or P-type thermoelectric elements. Present production techniques for the production of these thermoelectric elements are generally of two types. Thus, such thermoelectric elements may be fabricated by pressing and sintering; or alternatively they may be grown from a melt. Where the pressing and sintering technique is employed, the material is mechanically compacted so that subsequent annealing produces bonding and homogenization by diffusion, recrystallization and grain growth of the compacted material. Where growth techniques are employed, the material is melted to produce bonding and homogenization and then by controlling the freezing process, crystallization takes place.

The resulting product produced by the pressing and sintering process is in the form of large blocks which are subsequently sliced and cut up into smaller blocks of desirable size. The product produced by the growth technique is in the form of long rods, generally of a cylindrical configuration with a diameter equal to that of the desired finished pellet. The rods are thereafter sliced into short lengths of desired usable size.

After formation of the pellets of desired size, the formed pellet is cleaned, de-greased, sand blasted and etched to remove any contaminants or oxides from the surface, and the etched pellets are processed in one of two ways. One processing step involves the plating of the surface with a coating such as nickel or rhodium followed by a fluxing and solder coating of the plated surface in preparation for final assembly into thermoelectric modules. The other possible process to follow the etching is to solder coat the desired surface directly by utilizing special fluxes or solders which immediately prepares the pellet for assembly into a thermoelectric module.

Among the problems encountered in the utilization of the heretofore described conventional production techniques, for thermoelectric elements is the fact that there is a loss of the relatively expensive thermoelectric material due to the cutting kerf resulting from the slicing of the material into pellets of desired size. Additionally, there is further material loss due to the relatively brittle nature of most thermoelectric materials as a result of which they tend to break along the cleavage planes of the crystal when cut. Other problems are encountered in the cost of cleaning the pellets to remove surface oxides and other contaminants tending to interfere with desired current flow through the thermoelectric elements when they are assembled into a module.

It is accordingly among the primary objects of this invention to provide an improved method and apparatus for forming thermoelectric elements which does not require cutting of previously formed thermoelectric material into elements of desired size, and which does not require surface treatment of the formed thermoelectric elements to eliminate undesired contaminants interfering with desired current flow through the thermoelectric elements.

Another object of the invention is to provide an economical method of mass producing thermoelectric elements which require no cutting to thus eliminate kerf waste.

A further object of the invention is to produce a thermoelectric element of an oriented polycrystalline structure rather than a single crystal structure such as occurs in conventional growth from a melted process.

It is also an object of the invention to provide an improved thermoelectric element which is not subject to having oxides form on the surface thereof during production.

A further object of the invention is to provide a thermoelectric element with a surface of desired electrical conductivity.

Another important object of the invention is to provide means for producing thermoelectric elements directly in pellet form of desired dimension.

According to the invention, these and other objects which will become hereafter apparent are achieved by forming a melt of desired thermoelectric material, and containing this melt in an inert atmosphere. This is done in continuously operating pellet forming equipment in which individual pellets are continuously cast by depositing a melt of thermoelectric material in mold recesses of a continuously moving mold. The melt is cast into molds of a configuration corresponding to that of the desired pellets with the melt being kept in this inert atmosphere during casting. In order to insure proper crystal formation of the thermoelectric material as it is being cast, temperature and pressure controls are provided. The cast thermoelectric pellets are fed in the inert atmosphere directly through a fluxing chamber where the ends of the pellets are fluxed. Thereafter the pellets are conducted in the same inert atmosphere to a solder coating chamber after which the solder coated pellets are collected for use.

Among the features of the invention is the fact that by forming the thermoelectric elements in a controlled atmosphere, the formation of oxides on the surface of the pellet is substantially eliminated.

Another feature of the invention resides in the fact that the elimination of surface oxides serves to eliminate the need for etching and sand blasting of the pellets, and simplifies the fluxing and soldering process normally required.

Another important feature of the invention resides in the fact that the thermoelectric elements are crystallized directly into pellets of a desired usable size, thus eliminating the need for cutting and the resultant waste of material due to breakage and kerf loss.

Figure 2:
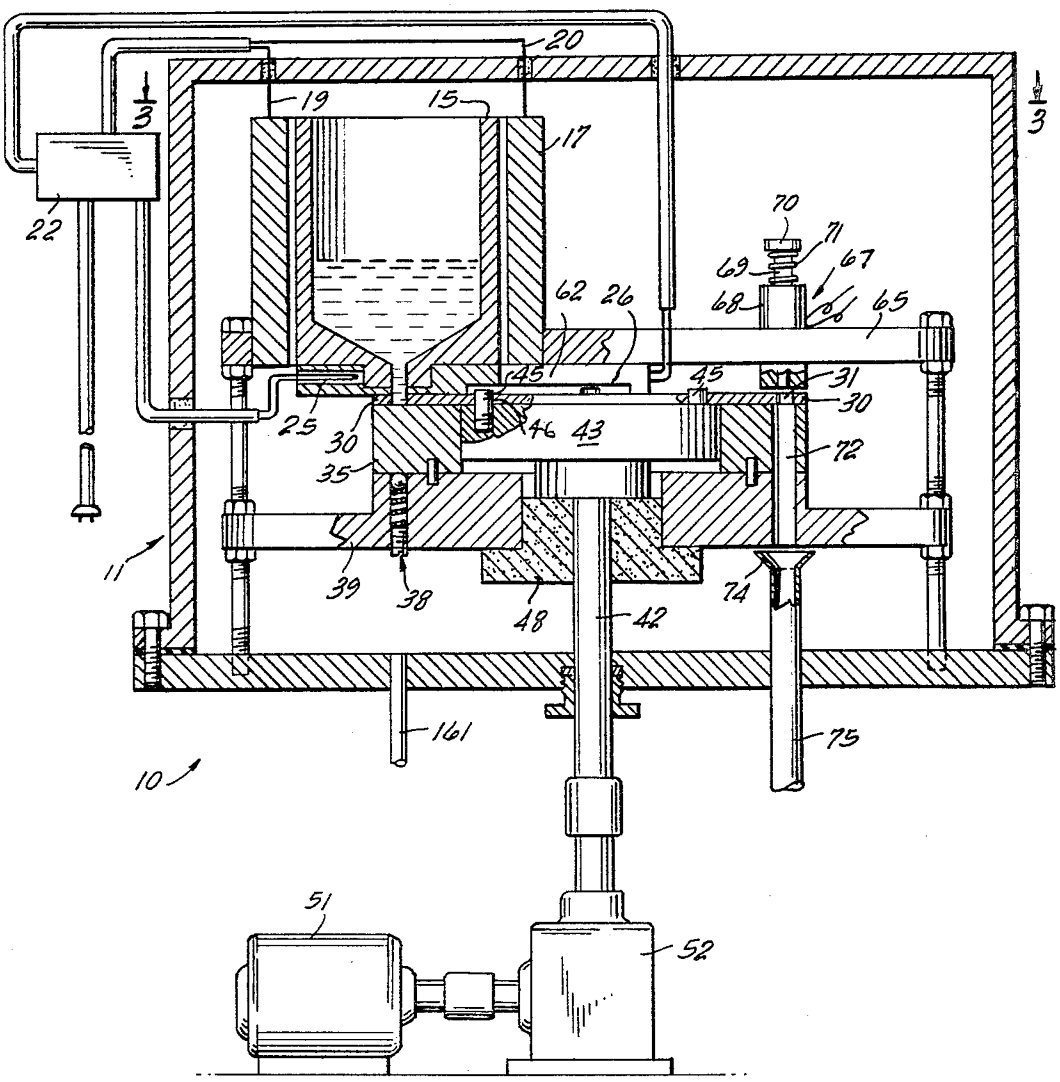
Figure 9:
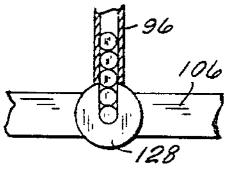
Figure 6:
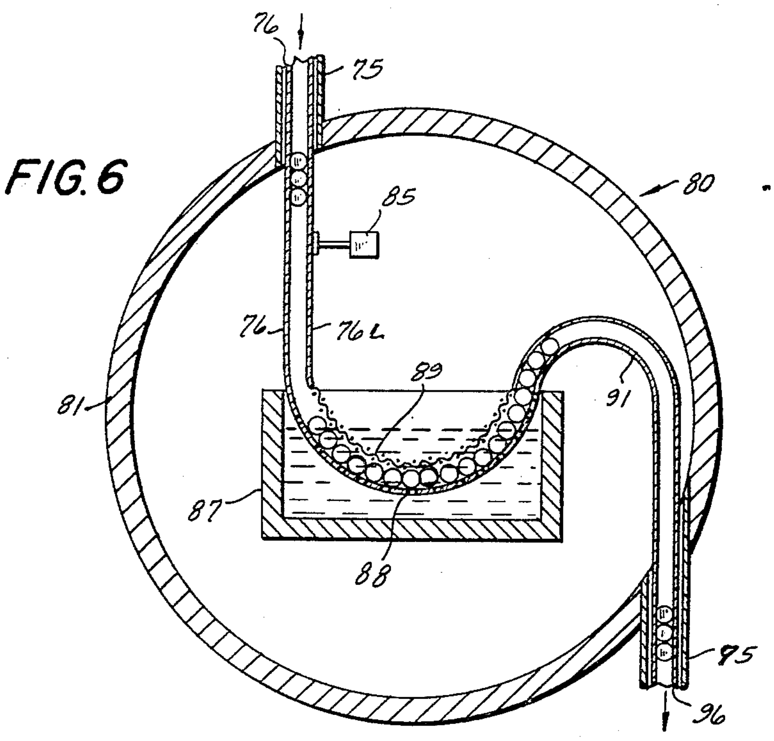
Figure 4:
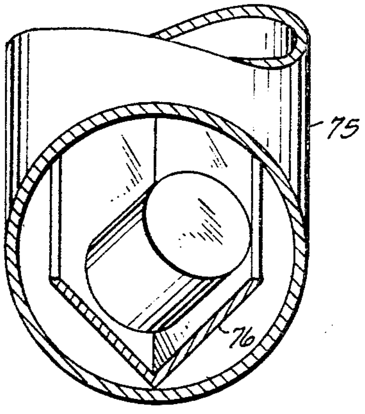
Figure 5:
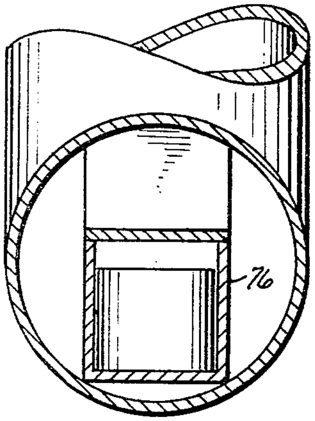
Figures 7, 8:
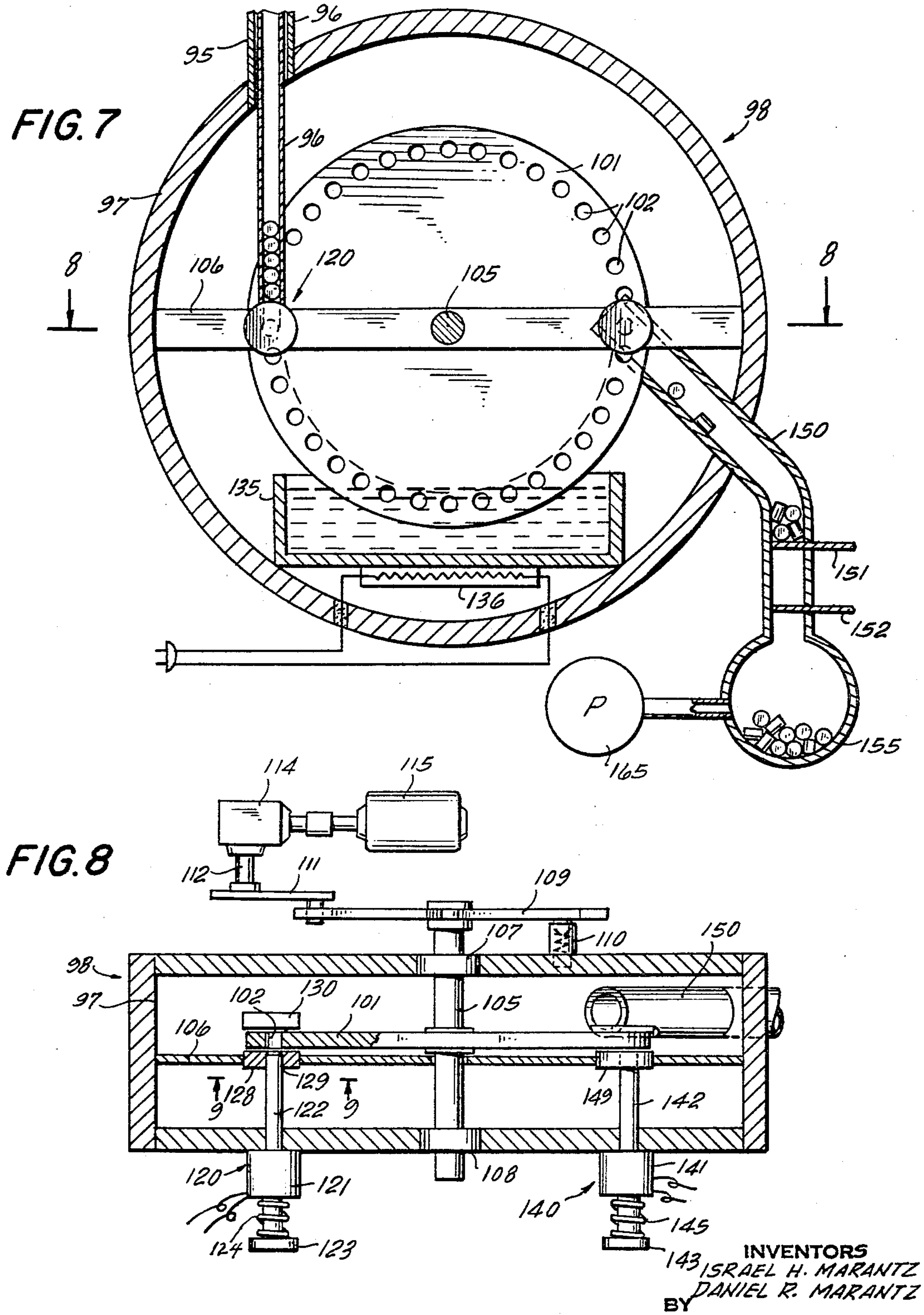

One or more embodiments of the invention will be described in conjunction with the accompanying drawings wherein:

FIG. 1 is a schematic diagram showing the arrangement of the production equipment utilized in producing thermoelectric elements in accordance with the teachings of this invention, FIG. 2 is a cross sectional elevational view through the pellet casting apparatus employed in forming the thermoelectric pellets from a melt of thermoelectric material, FIG. 3 is a cross sectional view taken on line 3—3 of FIG. 2 showing the relationship between the melt enclosing crucible and the pellet casting mold disc, FIG. 4 is a cross sectional view taken on line 4—4 of FIG. 1 through the pellet conduits between the casting apparatus and the fluxing chamber and between the fluxing chamber and the solder coater, showing the orienting chute in the conduit, FIG. 5 is a cross sectional view taken on another point along the pellet conduit of FIG. 1, FIG. 6 is a cross sectional elevational view through the fluxing chamber employed in the system shown in FIG. 1, FIG. 7 is a cross sectional elevational view of the solder coater employed in the system shown in FIG. 1, FIG. 8 is a cross sectional view taken on line 8—8 of FIG. 7 showing the solder coater, and FIG. 9 is a cross sectional view on line 9—9 of FIG. 8, showing the relationship between the orienting chute and the guide block.

Referring now more particularly to the drawings, like numerals in the various figures will be employed to designate like parts.

The thermoelectric pellet casting equipment 10 is enclosed in hermetic housing 11, as best seen in FIG. 2. Within housing 11 the equipment, as illustrated, comprises a melt containing crucible 15 formed of graphite and jacketed by a resistance heated furnace wall 17 energized by leads 19 and 20 which lead to a temperature controller 22 of conventional type utilizing rheostats or the like in conventional fashion.

Thermocouples 25 and 26 are connected to the temperature controller 22 to regulate the operation thereof as will be hereafter more fully described.

A casting mold disc 30 having a plurality of mold recesses 31 dimensioned of a size slightly larger than that of the desired pellet so as to provide for desired contraction of the pellet during molding, is rotatably arranged beneath the crucible 15. The mold disc 30 is preferably formed of mica having low heat conduction and is mounted for rotation over a graphite ring 35, having high heat conduction. The graphite ring 35, mold disc 30 and crucible 15 are maintained in contact by means of spring loading assembly 38 in lower base member 39.

The casting disc 30 is mounted for rotation by shaft 42 by supporting the casting disc 30 on shaft end plate 43 which is provided with upwardly extending protuberances 45 engaging in apertures 46 in the casting disc 30. Shaft 42 is extended through graphite bearing 48 which is secured to lower support plate 39. The shaft 42 is driven by motor 51 through transmission 52. As will be understood by those skilled in the art, appropriate shaft couplings and bearings are provided for the shaft and the connection between the motor 51 and transmission 52.

A heat control plate 62 is positioned between the bottom of crucible 15 and the top of casting disc 30 as best seen in FIG. 2. The heat control plate 62 is formed of materials having a relatively high coefficient of conductivity. Materials such as graphite, boron nitride or boron carbide are found particularly suitable. The heat control plate 62 is formed with apertures within which the thermocouples 25 and 26 are received and maintained in heat exchange relationship with the heat control plate 62. The contouring of the heat control plate 62 is such as to permit free rotation of the casting disc 30, and providing for heat exchange between the heat control plate 62 and the bottom of the crucible 15 as illustrated.

Mounted by upper support plate 65 is a solenoid actuated plunger mechanism 67 which comprises a solenoid 68 within which plunger 69 can reciprocate. The plunger 69 is formed with a cap end 70, and spring 71 is arranged between cap end 70 and the upper end of solenoid 68 so as to bias the plunger 69 upwardly to the position illustrated in FIG. 1. Energization of the solenoid 68 serves to draw the plunger 69 downwardly against the biasing force of spring 71 so that the lower end of plunger 69 will extend through mold recess 31 to eject a pellet contained therein. The solenoid is energized by a conventional timing circuit so that the plunger will be actuated to eject the pellet when the mold aperture 31 is aligned with the plunger.

Pellet discharge chute 72 is formed to extend through supporting ring 35 and bottom support plate 39 with the discharge chute 72 aligned with the path of reciprocation of plunger 69, as illustrated to the right in FIG. 1.

The lower end of pellet discharge chute 72 is positioned above inlet funnel 74 of pellet conduit 75 which extends in hermetically sealed relation through the bottom wall of housing 11.

Pellet conduit 75 is formed with an orienting chute 76, as best seen in FIGS. 4 and 5. In moving through the orienting chute 76 within conduit 75, the pellet is oriented to a desired position. In the illustrated embodiment of the invention, the desired orientation is shown as such as to align the cylindrically contoured pellets with their axes lying parallel to each other, as best seen in FIG. 6.

The aligned pellets are fed to fluxing chamber 80 as best seen in FIGS. 1 and 6. Fluxing chamber 80 is constituted by hermetically sealed housing 81 which is connected to the outlet end of pellet conduit 75. The connection between the outlet end of pellet conduit 75 and fluxing chamber housing 81 is such as to provide a gas tight seal between the interior of the housing 81 and the interior of conduit 75. The orienting chute 76 extends down into fluxing chamber 80 and is coupled to a vibrator 85 which maintains the orienting chute 76 in vibration, serving the implement movement of the pellets through the conduit 75 and into the fluxing chamber 80, and additionally implements orientation of the pellets.

A flux containing vessel 87 is contained within fluxing chamber housing 81. Within vessel 87, an arcuate trough 88 is arranged, with the upper surface of trough 88 aligned with the lower edge of orienting chute 76 (here numbered 76–L) so that the thermoelectric pellets may roll along the trough surface. In the illustrated embodiment, it is preferred to provide a screen member 89 above trough 88 serving to delimit the path of movement of the pellets through the flux containing vessel 87. By virtue of the connection between trough 88 and well 76–L of orienting chute 76, the trough 88 is also set into vibration by means of vibrator 85 as will be apparent to those skilled in the art. Discharge tube 91 is connected to the outlet end of trough 88 to receive the pellets as they leave the flux bath.

From the fluxing chamber 80, the pellets are fed to pellet conduit 95 having a pellet orienting chute 96 contained therein. Pellet conduit 95 is substantially identical in construction to conduit 75 as is pellet orienting chute 96 similar to pellet orienting chute 76. Conduit 95 is hermetically joined to the housing 81 of fluxing chamber 80 to effect a gas tight seal.

The outlet end of pellet conduit 95 is hermetically connected to housing 97 of soldering chamber 98 as best seen in FIG. 7. Housing 97 provides a hermetic enclosure for the contents of soldering chamber 98.

The solder coater 98 comprises a pellet supporting disc 101 having a plurality of pellet supporting apertures 102. The disc 101 is mounted for rotation on shaft 105 which is supported on cross bar 106 secured to the edges of housing 97 as best seen in FIGS. 7 and 8. Shaft 105 extends through bearings 107 and 108 on opposed side walls of the housing 97. As will be apparent to those skilled in the art, bearings 107 and 108 are provided with appropriate seals to insure hermetic sealing of the contents of housing 97. In the illustrated embodiment of the invention, a stepping motion is imparted to the disc 101. This is accomplished by means of Geneva disc 109, as best seen in FIG. 8 which is outwardly biased away from housing 97 by means of spring pressed ball assembly 110. Geneva disc 109 is driven by drive link 111 mounted for rotation on transmission shaft 112 extending from transmission 114 which is driven by motor 115.

In order to effect positioning of the thermoelectric pellets receiving apertures 102, a solenoid operated plunger assembly 120 is arranged at the discharge end of orienting chute 96, as best seen to the left in FIGS. 7 and 8. Solenoid actuated plunger assembly 120 comprises a solenoid 121 within which plunger 122 is mounted for reciprocation. The upper end of plunger 122 is formed with cap end 123 and spring 124 is arranged between cap end 123 and the upper end of solenoid 121 to bias the plunger 122, as viewed in FIG. 8.

A guide block 128 having plunger aperture 129 is supported in cross bar 106 at one side of pellet supporting disc 101. On the other side of pellet supporting disc 101, a backing plate 130 is arranged. The spacing between guide block 128 and backing block 130 is such as to permit free movement of pellet supporting disc 101, but at the same time restrict the movement of the pellet into the pellet receiving aperture 102 in disc 101.

Positioned within housing 97 of solder coating chamber 98 is a solder bath 135 within which the molten solder is contained. The molten solder within bath 135 is heated by means of electrical heating element 136 arranged in heat exchange relationship with the contents of bath 135, as illustrated in FIG. 7. As will be understood by those skilled in the art, energization of the heating element 136 is effected by means of electrical leads which are extended through the housing 97 in a gas tight manner in conventional fashion by the utilization of appropriate seals and gasketing.

Ejection of the solder coated thermoelectric pellets is accomplished by means of ejection solenoid plunger 140 as seen to the right in FIGS. 7 and 8. Solenoid plunger 140 is similar to solenoid plunger 120 and 67, previously described; this solenoid plunger 140 comprises a solenoid 141 within which plunger 142 is mounted for reciprocation. A cap end 143 is formed on one end of the solenoid plunger 142, and spring 145 is arranged between the cap end 143 and the solenoid body 141 to bias the plunger 142 downwardly as viewed in FIG. 8. Plunger guide block 149 is mounted in cross bar 106 and is formed with an aperture permitting passage therethrough of plunger 142 so as to eject the pellet contained within disc 101 into discharge conduit 150 which extends in gas tight relation through the side walls of housing 97 as seen to the right in FIGS. 7 and 8.

In order to maintain a desired hermetic seal of the atmosphere surrounding the pellets, the discharge conduit 150 is provided with gating elements 151, 152 as schematically shown to the right in FIG. 7. In order to effect discharge of the pellets through the discharge conduit 150, the upper gate 151 is first moved out of the flow path in conduit 150 to permit the pellets to descend to the lower gate 152, after which upper gate 151 is moved to a position sealing off the conduit 150.

Thereafter, displacement of lower gate member 152 from the flow path of discharge conduit 150 permits the pellets previously released by upper gate member 151 to fall to collection chamber 155.

In use, the aforedescribed pellet forming apparatus 10, fluxing chamber 80, solder coater 98 and collection chamber 155 are connected into a hermetically sealed system as schematically illustrated in FIG. 1.

A gas supply 160, as seen to the left in FIG. 1, is connected to gas inlet tube 161 coupled to the housing 11 which forms a hermetic seal about the pellet forming equipment as seen in FIG. 2. Since all of the components are hermetically interconnected, it will be understood by those skilled in the art that any gas admitted from gas supply 160 serves to produce the inert atmosphere in which the pellets are handled in the system shown in FIG. 1. The collection chamber 155 implements the maintenance of desired gas pressure within the system, aided by pump 165.

Before the system is set into operation, the crucible 15 is charged with appropriate thermoelectric material. This material is melted as will be understood by those skilled in the art as a result of the energization of electric furnace 17.

The melt within crucible 15 is kept under exact temperature control by means of thermocouples 25 and 26 which serve to maintain a critical temperature gradient across the mold recesses to insure multiple crystal growth within the mold disc 30.

The heated melt flows from the crucible 15 into the mold apertures 31. Multiple seeding for the crystal growing process occurs due to the surface roughness or imperfections on the surface of the graphite supporting ring 35 against which the melt flows when it is charged from the crucible 25 into the mold apertures 31. These surface roughnesses or imperfections act as nucleation centers for growth of polycrystalline thermoelectric elements.

The mold disc is made of a temperature stable material having an extremely low heat transfer coefficient in a range of values between 1 and 10 B.t.u./hr./ft.$^2$/° F./inch.

The relatively high heat conductivity of disc 26 and ring 35 serves to maintain a heat flow in the pellet perpendicular to the direction of rotation of the mold disc, and progressive cooling of the pellet from its lower end to its upper end.

The timing of rotating of the disc is such that by the time the pellet has reached a position beneath solenoid actuated plunger 67, it has solidified.

The entire operation is performed in a controlled atmosphere such as argon under appropriate pressure, thus serving to eliminate any oxidation on the surfaces.

From the pellet forming equipment 10, the formed pellets which require no additional surface treatment, or cutting, move in the same inert atmosphere to the fluxing chamber where they pass through the fluxing bath under the vibratory action of the orienting chute and then move to the solder coater.

In the solder coater the formed pellets are transferred to the disc 101 by the action of pellet positioning solenoid actuator plunger 120 which serves to force the pellets into the pellet receiving apertures 102 in disc 101. The dimensioning of apertures 102 is such as to insure a snug fit between the side walls of the pellets and the side walls of the apertures 102. As a result of this snug fit, the passage of the pellets through the solder bath 135 only exposes the ends of the cylindrical pellets for solder coating.

Thereafter, the solder coated pellets are ejected and discharged into collecting chamber 155 for bulk removal.

It is thus seen that a simple continuous technique has been provided for the formation of thermoelectric elements of desired dimension with appropriate soldered surfaces to implement arrangement of the pellets in a desired module.

As many changes could be made in the above construction, and many apparently widely different embodiments of this invention could be made without departing from the scope of the claims, it is intended that all matter contained in the above description or shown in the accompanying drawings shall be interpreted as illustrative and not in a limiting sense.

Having thus described our invention, what we claim as new and desire to secure by Letters Patent of the United States is:

1. Equipment for forming thermoelectric elements, said equipment comprising mold means in which pellets of thermoelectric material are cast, means providing progressive cooling of said cast pellet from the lower end to the upper end thereof, solder coating means for applying a solder coating at two spaced points on the pellets cast in said mold means, and enclosure means enclosing said mold means and said solder coating means in an inert atmosphere.

2. The combination set forth in claim 1 in which fluxing means are provided in said inert atmosphere in a flow path between said pellet forming means and said solder coating means, whereby the spaced points on the pellets are fluxed prior to solder coating.

3. The combination set forth in claim 1 in which said mold means are provided with nucleation centers for promoting crystalline growth of a melt of thermoelectric material in said mold means.

4. Apparatus for forming thermoelectric elements, said apparatus comprising a crucible in which a melt of thermoelectric material is formed, a mold member movably mounted adjacent an outlet of said crucible to permit deposit of melted thermoelectric material from said crucible into a mold recess in said mold member, means associated with said recess providing progressive cooling of said cast pellet from the lower end of the mold recess to its upper end, a housing surrounding said crucible and said mold member, said housing containing an inert atmosphere, a pellet conduit hermetically coupled to said housing to receive the pellet formed in the recess of said mold member, and a fluxing chamber hermetically coupled to said pellet conduit at the end thereof remote from said housing.

5. Apparatus as in claim 4 in which said fluxing chamber comprises a flux containing trough through which the pellets from said conduit are directed.

6. Apparatus as in claim 5 in which a pellet orienting chute is arranged within said conduit coupled to said trough, and a vibrator is arranged in said fluxing chamber to vibrate the chute and trough.

7. Apparatus as in claim 4 in which a solder coater is hermetically coupled to said fluxing chamber to receive fluxed pellets therefrom in the inert atmosphere.

8. Apparatus as in claim 7 in which said solder coater comprises a pellet supporting disc having a plurality of pellet receiving apertures in which the pellets are received with two spaced points exposed, and a solder bath through which said disc is rotated to coat the exposed points of the pellets.

References Cited

UNITED STATES PATENTS

| | | | |
|---|---|---|---|
| 2,140,607 | 12/1938 | Thompson | 164—66 X |
| 2,172,745 | 9/1939 | Witte | 29—33 |
| 3,296,682 | 1/1967 | Cofer et al. | 29—33 |

WILLIAM I. BROOKS, *Primary Examiner.*